United States Patent
Kumagai (12)

(10) Patent No.: US 6,643,840 B2
(45) Date of Patent: Nov. 4, 2003

(54) DESIGNING METHOD OF SEMICONDUCTOR INTEGRATED CIRCUIT USING LIBRARY STORING MASK PATTERN OF MACRO CIRCUIT AND DESIGNING APPARATUS EXECUTING THE SAME

(75) Inventor: Kouichi Kumagai, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/775,590

(22) Filed: Feb. 5, 2001

(65) Prior Publication Data

US 2001/0016934 A1 Aug. 23, 2001

(30) Foreign Application Priority Data

Feb. 18, 2000 (JP) ........................................ 2000-041647

(51) Int. Cl.[7] .............................................. G06F 17/50
(52) U.S. Cl. ............................................. 716/19; 716/1
(58) Field of Search ........................................ 716/1–19

(56) References Cited

U.S. PATENT DOCUMENTS

| | | | | |
|---|---|---|---|---|
| 4,377,849 A | * | 3/1983 | Finger et al. ................ | 257/202 |
| 4,893,168 A | * | 1/1990 | Takahashi et al. ........... | 257/203 |
| 5,019,889 A | * | 5/1991 | Shintani et al. .............. | 257/203 |
| 5,081,515 A | * | 1/1992 | Murata et al. ............... | 257/296 |
| 5,247,456 A | * | 9/1993 | Ohe et al. ....................... | 716/9 |
| 5,359,562 A | * | 10/1994 | Yasui et al. .................. | 257/297 |
| 5,410,173 A | * | 4/1995 | Kikushima et al. .......... | 257/368 |
| 6,269,468 B1 | * | 7/2001 | Dean et al. ...................... | 716/2 |
| 6,340,825 B1 | * | 1/2002 | Shibata et al. ............... | 257/207 |

FOREIGN PATENT DOCUMENTS

| | | | |
|---|---|---|---|
| JP | 62-23131 | 1/1987 | |
| JP | 363228661 A | * 9/1988 | ........... H01L/27/08 |
| JP | 1-293534 | 11/1989 | |
| JP | 4-78153 | 3/1992 | |
| JP | 2575180 | 10/1996 | |
| JP | 11-260923 | 9/1999 | |

OTHER PUBLICATIONS

Schilling et al. "Electronic Circuits, Discrete and Integrated", McGraw–Hill, Inc., 1979, pp. 153–155.*

* cited by examiner

*Primary Examiner*—Vuthe Siek
*Assistant Examiner*—Sun James Lin
(74) *Attorney, Agent, or Firm*—McGinn & Gibb, PLLC

(57) ABSTRACT

A designing method of a semiconductor integrated circuit is composed of providing a library storing a macro mask pattern for a macro circuit including buffer circuits, selecting one of the buffer circuits as a selected buffer circuit and arranging the macro mask pattern and a third wiring pattern to produce an integrated circuit mask. Each of buffer circuits is composed of first and second wirings apart from each other, a firs semiconductor element selectively supplying the first wiring with a power supply potential in accordance with the output signal and a second semiconductor element selectively supplying the second wiring with a grounded potential in accordance with the output signal. The macro mask pattern includes buffer mask patterns, each of which corresponds to one of the buffer circuits. Each of the buffer mask patterns is composed of a first wiring pattern for the first wiring, and a second wiring pattern for the second wiring. In the integrated circuit mask pattern, the first and second wiring patterns of the selected buffer circuit are connected with each other by the third wiring pattern.

15 Claims, 14 Drawing Sheets

DESIGNING METHOD OF SEMICONDUCTOR INTEGRATED CIRCUIT USING LIBRARY STORING MASK PATTERN OF MACRO CIRCUIT AND DESIGNING APPARATUS EXECUTING THE SAME

BACKGROUND OF THE INVENTION

1. Field of the Invention

The present invention relates to a designing method of a semiconductor integrated circuit. Particularly, the present invention relates to a designing method of a semiconductor integrated circuit using a library storing a mask pattern of a macro circuit.

2. Description of the Related Art

When a layout of a semiconductor integrated circuit is designed, a macro circuit is used which is a circuit block having a certain function. The usage of the macro circuit facilitates design of the layout.

A layout method for a semiconductor integrated circuit using a macro circuit is disclosed in Japanese Laid Open Patent Application (JP-A-Heisei 1-293534) and corresponding Japanese Patent No. 2575180. In the known layout method, mega-cells 101, 102 and 103 constituted by combinations of a plurality of standard cells are arranged as shown in FIG. 1. A macro circuit 101 has terminals Pa1 to Pa3, terminals Pb1 to Pb3 and terminals Pc1 to Pc3. The terminals Pa1 to Pa3, the terminals Pb1 to Pb3 and the terminals Pc1 to Pc3 are located in a plurality of sides on a rectangular area defining the macro circuit 101. Wirings connected to the macro circuit 101 are connected to the terminals Pa1 to Pa3, the terminals Pb1 to Pb3 and the terminals Pc1 to Pc3. The known layout method protects the mounted wiring from bypassing the macro circuit 101.

However, an output buffer for outputting a signal from the macro circuit is not noted in the above-mentioned Japanese Laid Open Patent Application (JP-A-Heisei 1-293534) and corresponding Japanese Patent No. 2575180.

Another layout method for a semiconductor integrated circuit is disclosed in Japanese Laid Open Patent Application (JP-A-Heisei, 4-78153). In this known layout method, a logical cell array 202, memories 204, 205 and input/output buffer cell 206s are mounted in a semiconductor integrated circuit 201, as shown in FIG. 2. A large number of logical cells 203, which are small-scale macro cells, are mounted in the logical cell array 202. The memories 204, 205 are large-scale macro cells. The input/output buffer cells 206 are small-scale macro cells. In this known semiconductor integrated circuit, the wiring between the small-scale macro cells is laid so as to bypass the memories 204, 205.

At first, terminal extension areas 211, 212 and 213 are defined around the memories 204 and 205, as shown in FIG. 3. Terminals of the logical cells 203 and the input/output buffer cells 206, are extensively laid in the terminal extension areas 211, 212 and 213. Extensive positions 211a, 212a and 213a of the terminal are defined as tip ends of the terminal extension areas 211, 212 and 213.

Moreover, extensive routes 211b, 212b and 213b are defined from the terminal of the input/output buffer cell 206 to the respective extensive positions 211a, 212a and 213a, as shown in FIG. 4.

Moreover, as shown in FIG. 2, a terminal B of the input/output buffer cell 206 is extended up to the respective extensive positions 211a, 212a and 213a along the extensive routes 211b, 212b and 213b. The extended terminal B is referred to as an extensive terminal B1 hereinafter. The extensive terminal B1 is connected to a terminal A of the logical cell 203.

This known layout method can shorten a time required to find out a wiring route of a wiring for connecting the logical cell 203 and the input/output buffer cell 206.

Also, still another layout method for a semiconductor integrated circuit is disclosed in Japanese Laid Open Patent Application (JP-A-Heisei, 11-260923). In this known layout method for the semiconductor integrated circuit, a spare cell is mounted in addition to usage cells. When the design of the circuit is changed, the spare cell is used to easily change the circuit. This known layout method relates to the layout method for the spare cell.

A spare cell having a structure shown in FIG. 5 is firstly placed in designing a semiconductor integrated circuit. The spare cell is provided with a P-type MOS transistor 301 and an N-type MOS transistor 302. A source 301a of the P-type MOS transistor 301 and a source 302a of the N-type MOS transistor 302 are respectively connected through wirings 307, 306 to a ground line 316. Both the sources 301a, 302a are electrically separated from a power supply line 315.

When a circuit included in the semiconductor integrated circuit is changed, the spare cell is used. When the spare cell is used, its structure is changed as shown in FIG. 6. The source 301a of the P-type MOS transistor 301 is separated from the ground line 316 and connected through a wiring 310 to the power supply line 315. Thus, the spare cell serves as an inverter. The usage of the spare changes the circuit included in the semiconductor integrated circuit.

When the spare cell placed in this known layout method is at a non-usage state, there is no route through which a current flows from the power supply cell 315 to the ground line 316. Thus, it is possible to reduce a consumptive current in the semiconductor integrated circuit designed on the basis of this known layout method.

Also, a semiconductor integrated circuit in which a consumptive current is reduced is disclosed in Japanese Laid Open Patent Application (JP-A-Showa, 62-23131). In this known semiconductor integrated circuit, a usage unit cell 404 and a non-usage unit cell 404A are mounted as shown in FIG. 7. In the usage unit cell 404, MISFETs Qp', Qn' are connected through a wiring 416' to each other. The MISFETs Qp', Qn' constitute an inverter. An output signal of the inverter is outputted from the wiring 416'. On the other hand, the non-usage unit cell 404A contains MISFETs Qp, Qn. A wiring 416 is cut away, and drain areas 410, 411 of the MISFETs Qp, Qn are electrically separated from each other. Thus, it is possible to reduce a consumptive current in the semiconductor integrated circuit.

However, an arrangement of a macro circuit is not noted in Japanese Laid Open Patent Application (JP-A-Heisei, 11-260923 and JP-A-Showa 62-23131).

SUMMARY OF THE INVENTION

An object of the present invention is to provide a wiring method for a semiconductor integrated circuit, in which a wiring included in the semiconductor integrated circuit can be designed so as not to bypass a macro circuit, an apparatus for wiring a semiconductor integrated circuit, and a macro library.

Another object of the present invention is to provide a wiring method for a semiconductor integrated circuit, which can reduce a consumptive power of a designed semiconductor integrated circuit, an apparatus for wiring a semiconductor integrated circuit, and a macro library.

Still another object of the present invention is to provide a wiring method for a semiconductor integrated circuit, in which a wiring included in the semiconductor integrated circuit can be designed so as not to bypass a macro circuit, and further a consumptive power of the designed semiconductor integrated circuit is reduced, an apparatus for wiring a semiconductor integrated circuit, and a macro library.

In order to achieve an aspect of the present invention, a designing method of a semiconductor integrated circuit is composed of providing a library storing a macro mask pattern for a macro circuit including buffer circuits, selecting one of the buffer circuits as a selected buffer circuit and arranging the macro mask pattern and a third wiring pattern to produce an integrated circuit mask. Each of buffer circuits is composed of first and second wirings apart from each other, and first and second semiconductor elements. The first semiconductor element selectively supplies the first wiring with a power supply potential in accordance with the output signal. The second semiconductor element selectively supplies the second wiring with a grounded potential in accordance with the output signal. The macro mask pattern includes buffer mask patterns, each of which corresponds to one of the buffer circuits. Each of the buffer mask patterns is composed of a first wiring pattern for the first wiring, and a second wiring pattern for the second wiring. In the integrated circuit mask pattern, the first and second wiring patterns of the selected buffer circuit are connected with each other by the third wiring pattern.

The first semiconductor element is desirably a P-channel MISFET including a first source connected to a power supply line having a power supply voltage, a first drain connected to said first wiring, and a first gate having a first gate voltage in response to said output signal.

The second semiconductor element is desirably an N-channel MISFET including a second source connected to a grounded line, a second drain connected to said first wiring and a second gate having a first gate voltage in response to said output signal.

The macro mask pattern may be accommodated in a rectangular area having four sides. In this case, one of said plurality of buffer mask patterns is located on one of said four sides, and another one of said plurality of buffer mask patterns is located on another one of said four sides.

The integrated circuit mask pattern may include a cell mask pattern for a cell included said semiconductor integrated circuit and said third wiring is connected to said cell. In this case, said selected buffer circuit is selected such that said third wiring is as short as possible.

In order to achieve another aspect of the present invention, a designing apparatus of a semiconductor integrated circuit is composed of a library and an arrangement wiring tool. The library stores a macro mask pattern for a macro circuit. The macro circuit includes an inner circuit outputting an output signal and a plurality of buffer circuits. Each of the plurality of buffer circuits is composed of first and second wirings apart from each other, a first semiconductor element selectively supplying said first wiring with a power supply potential in accordance with said output signal, and a second semiconductor element selectively supplying said second wiring with a grounded potential in accordance with said output signal. The macro mask pattern includes a plurality of buffer mask patterns, each of which corresponds to one of said plurality of buffer circuits. Each of said plurality of buffer mask patterns is composed of a first wiring pattern for said first wiring and a second wiring pattern for said second wiring. The arrangement wiring tool selects one of said plurality of buffer circuits as a selected buffer circuit. The arrangement wiring tool arranges said macro mask pattern and a third wiring pattern for a third wiring to produce an integrated circuit mask pattern based on said library such that said first and second wiring patterns of said selected buffer circuit are connected with each other by said third wiring pattern.

In order to achieve still another aspect of the present invention, a computer-readable recording medium records a library for designing an integrated circuit. The library is composed of a macro mask pattern for a macro circuit. The macro circuit includes an inner circuit outputting an output signal and buffer circuits. Each of the buffer circuits is composed of first and second wirings apart from each other, and first and second semiconductor elements. The first semiconductor element selectively supplies the first wiring with a power supply potential in accordance with the output signal. The second semiconductor element selectively supplies the second wiring with a grounded potential in accordance with the output signal. The macro mask pattern includes buffer mask patterns, each of which corresponds to one of the buffer circuits. Each of the buffer mask patterns is composed of a first wiring pattern for the first wiring, and a second wiring pattern for the second wiring.

DESCRIPTION OF THE PREFERRED EMBODIMENTS

A designing method of a semiconductor integrated circuit of an embodiment according to the present invention will be described below with reference to the attached drawings.

Figure 1:
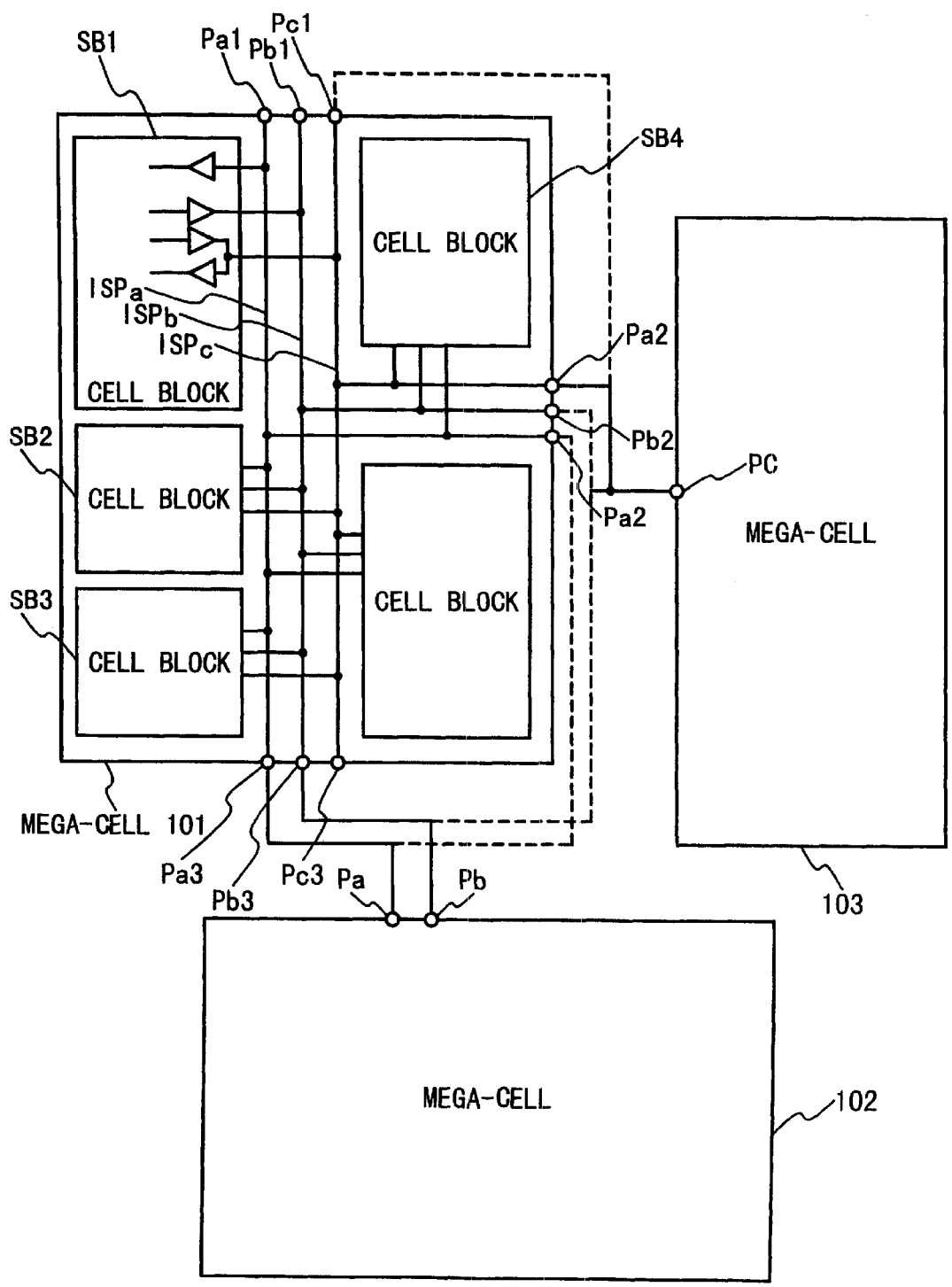
FIG. 1 shows a conventional layout method for a semiconductor device.
Figure 2:
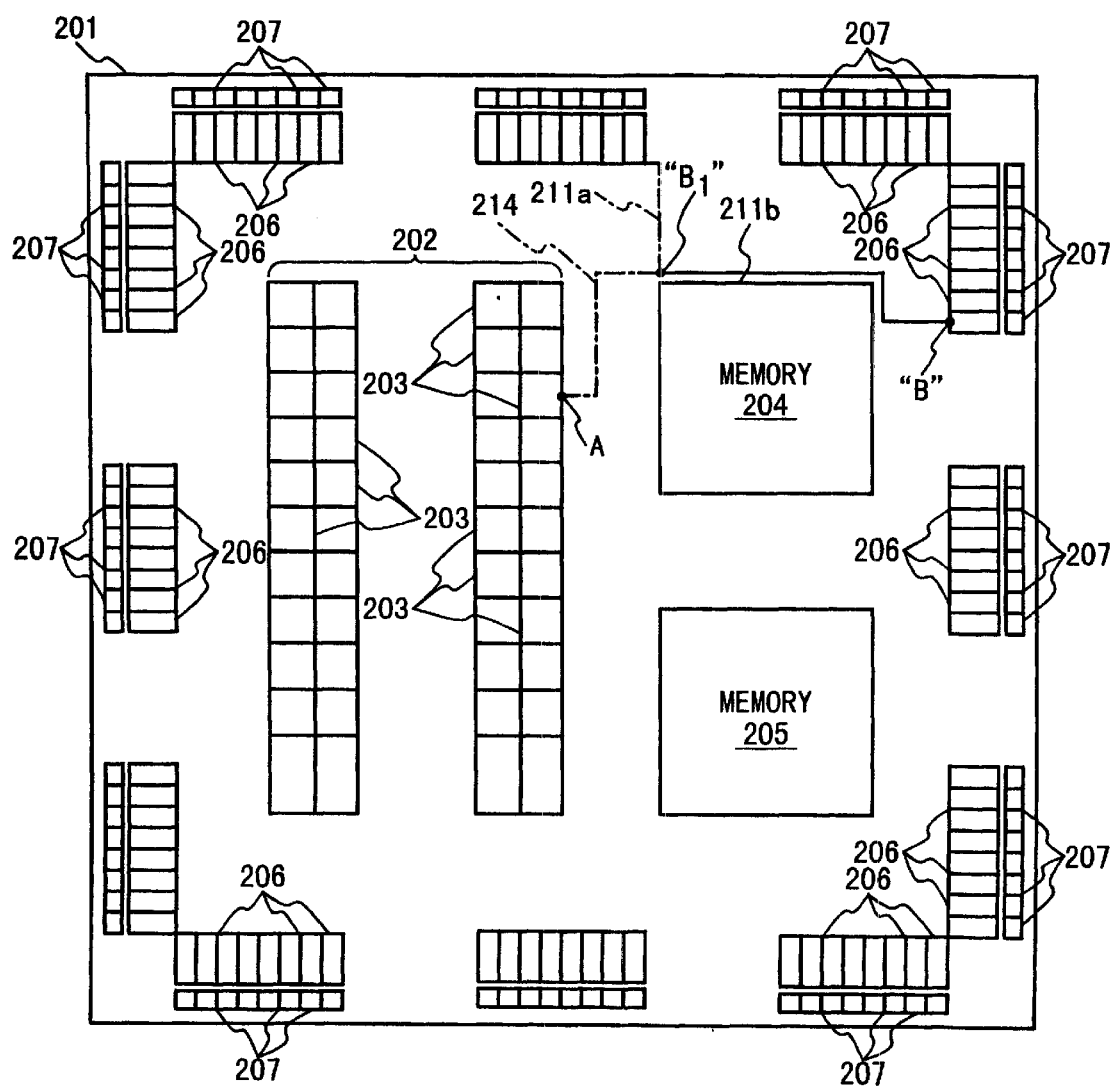
FIG. 2 shows another conventional layout method for a semiconductor device.
Figure 3:
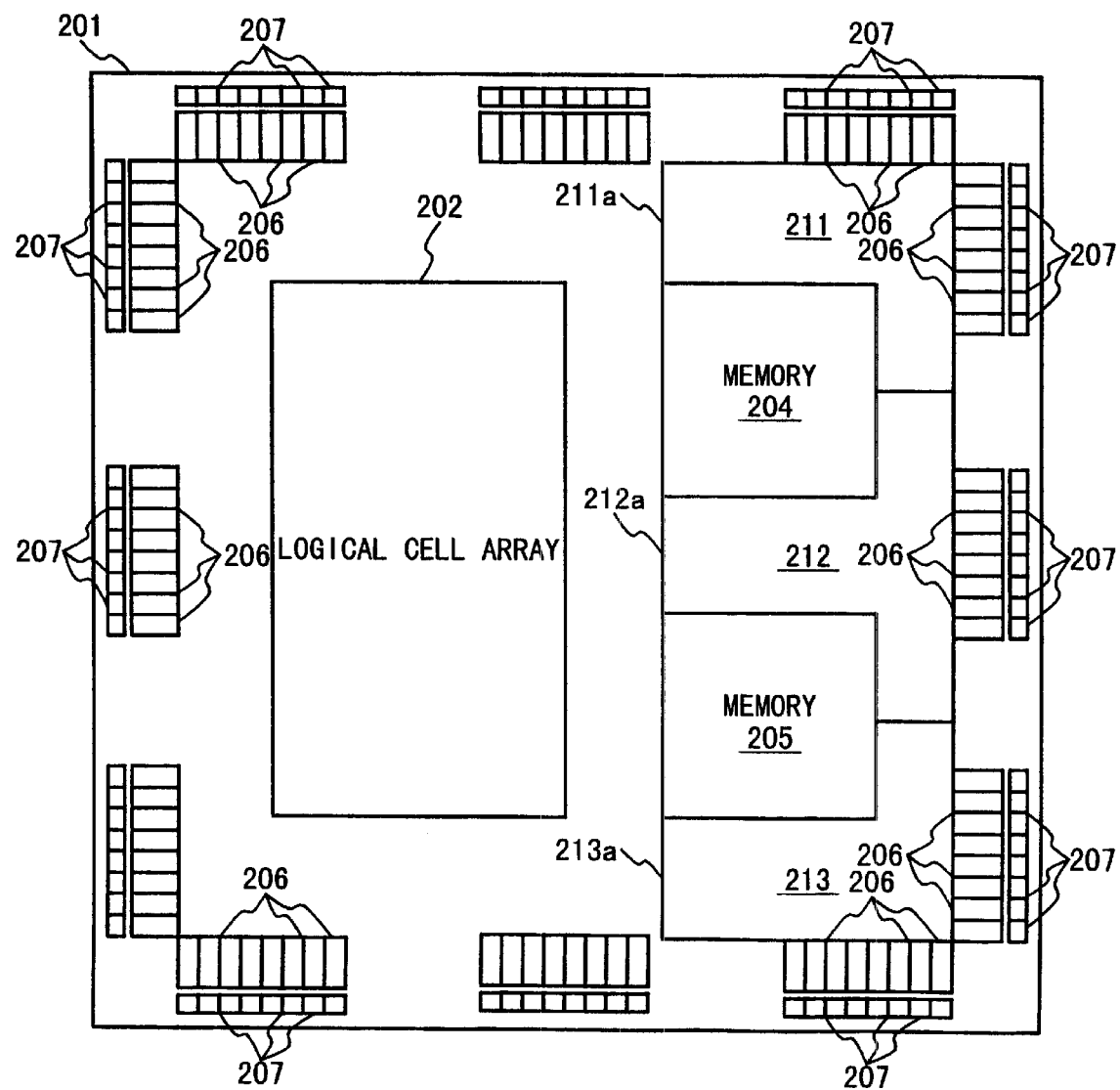
FIG. 3 shows the other conventional layout method for a semiconductor device.
Figure 4:
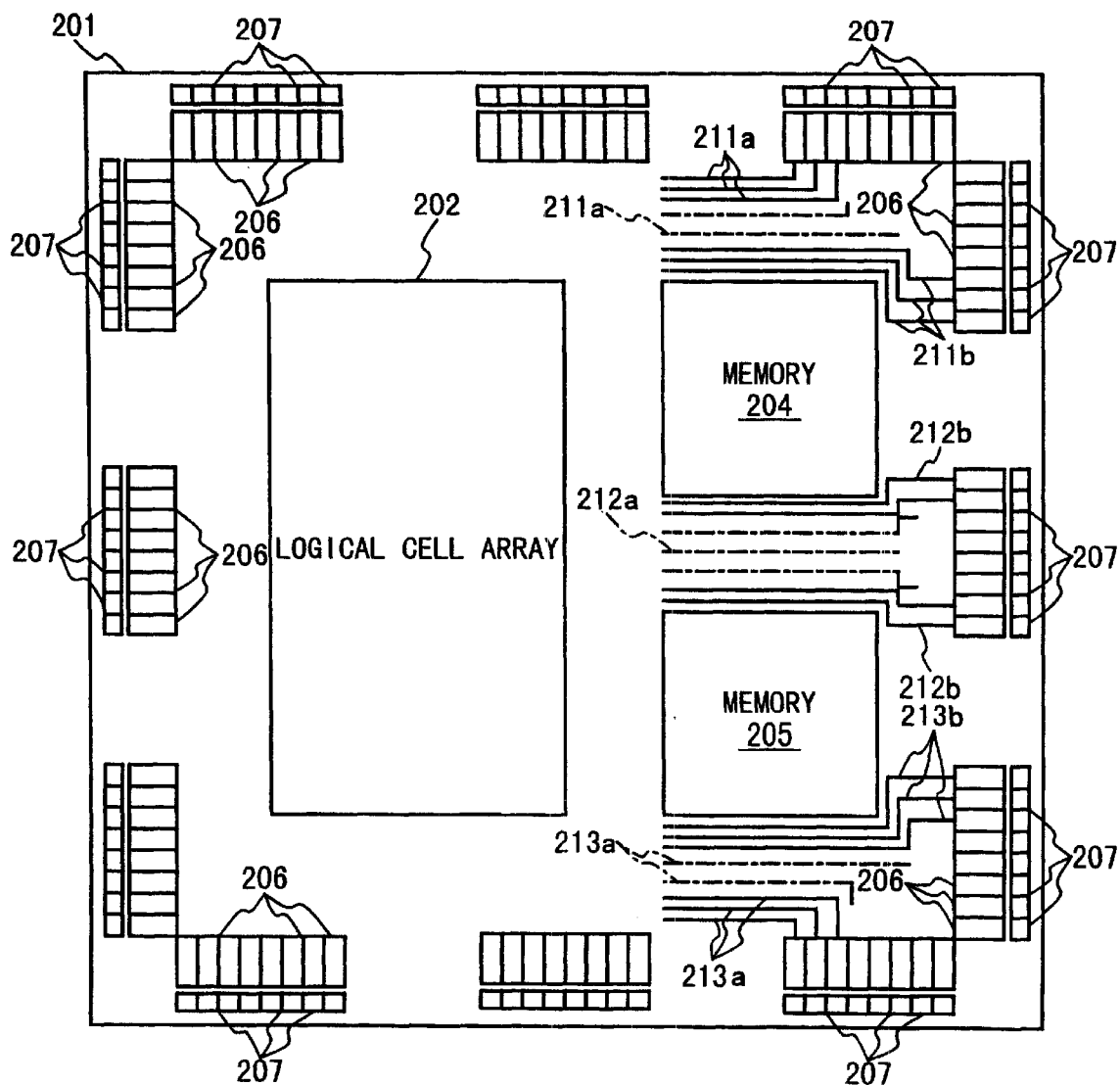
FIG. 4 shows the other conventional layout method for a semiconductor device.
Figure 5:
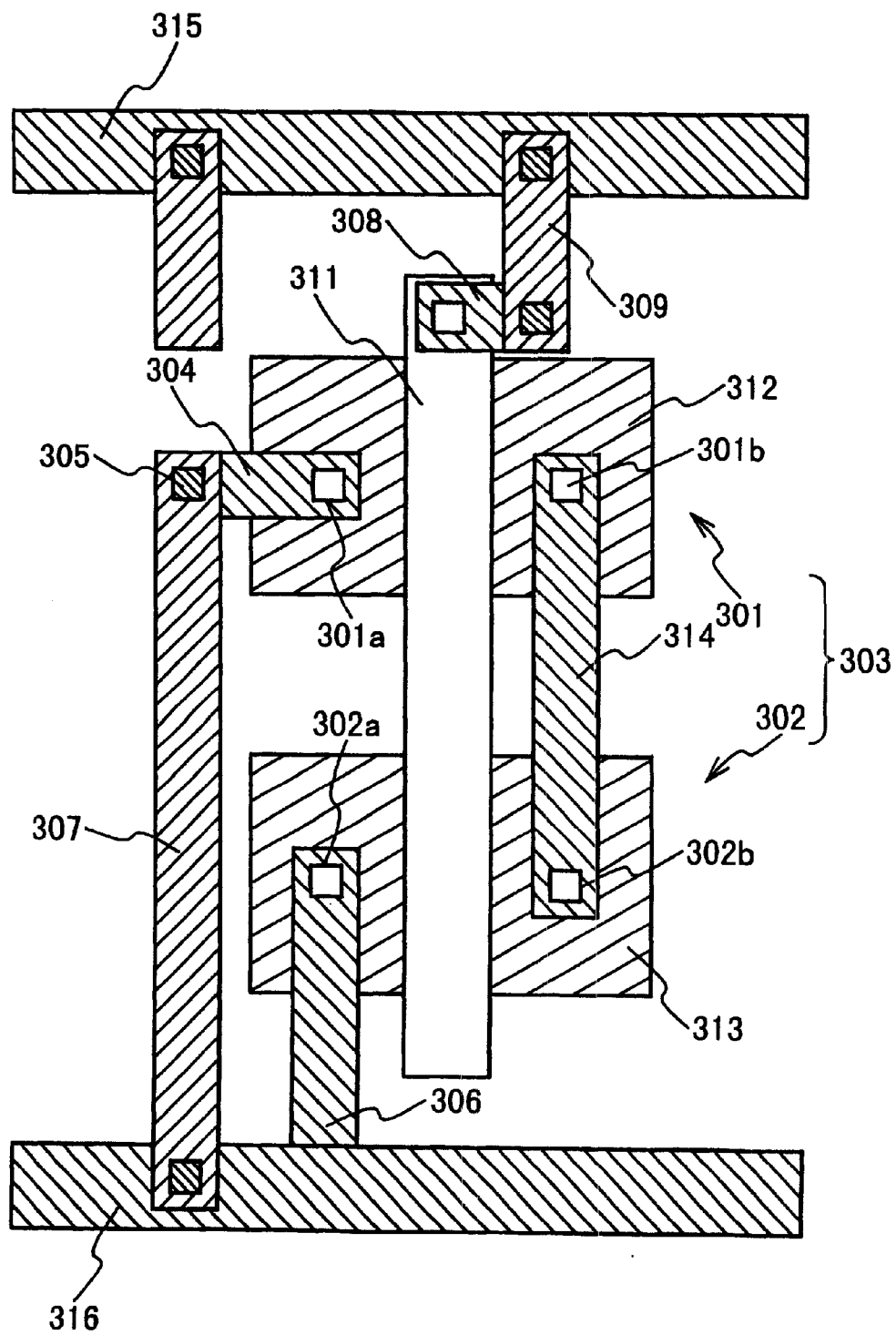
FIG. 5 shows a structure of a spare cell used in still another conventional layout method.
Figure 6:
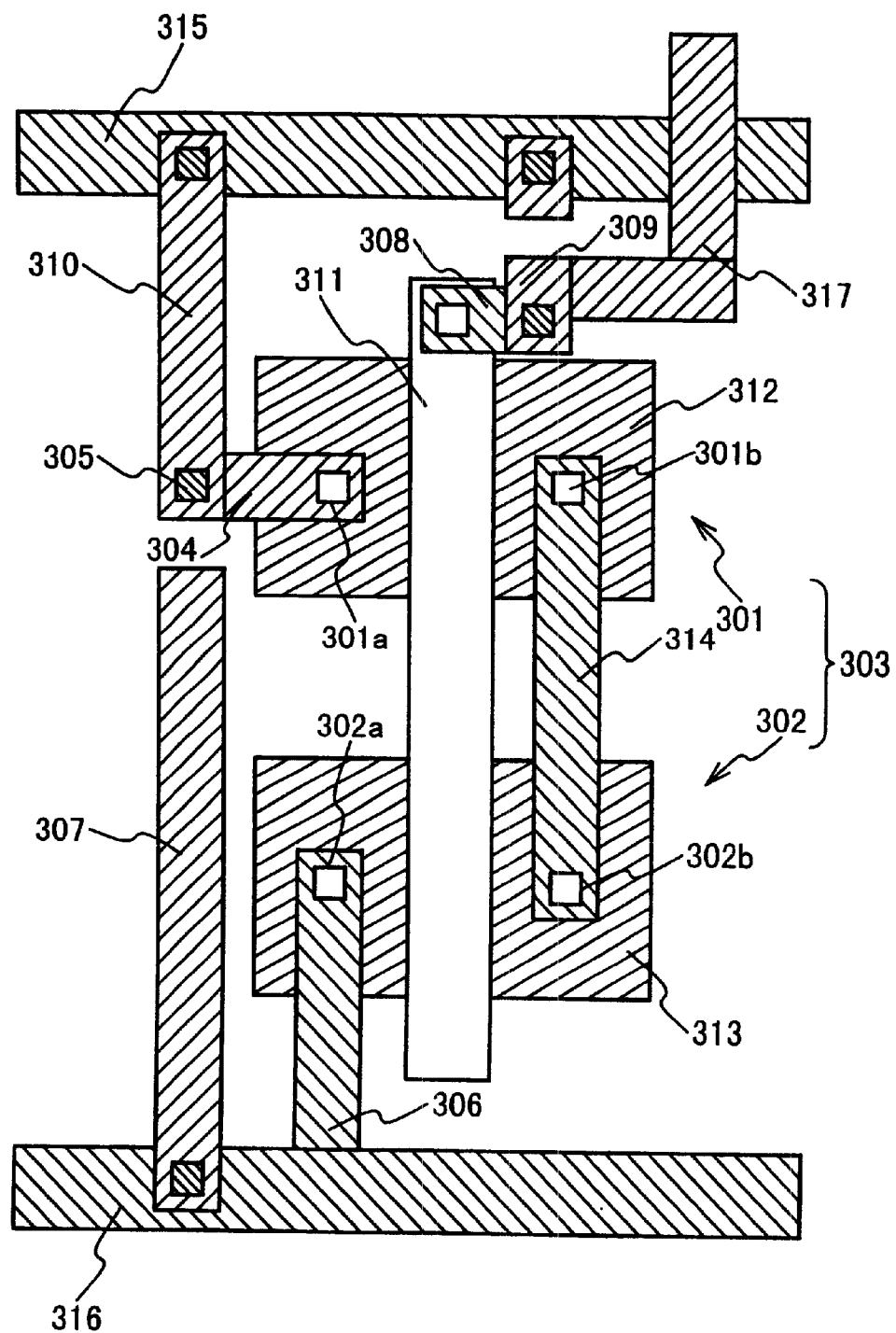
FIG. 6 shows a structure of a spare cell used in still another conventional layout method.
Figure 7:
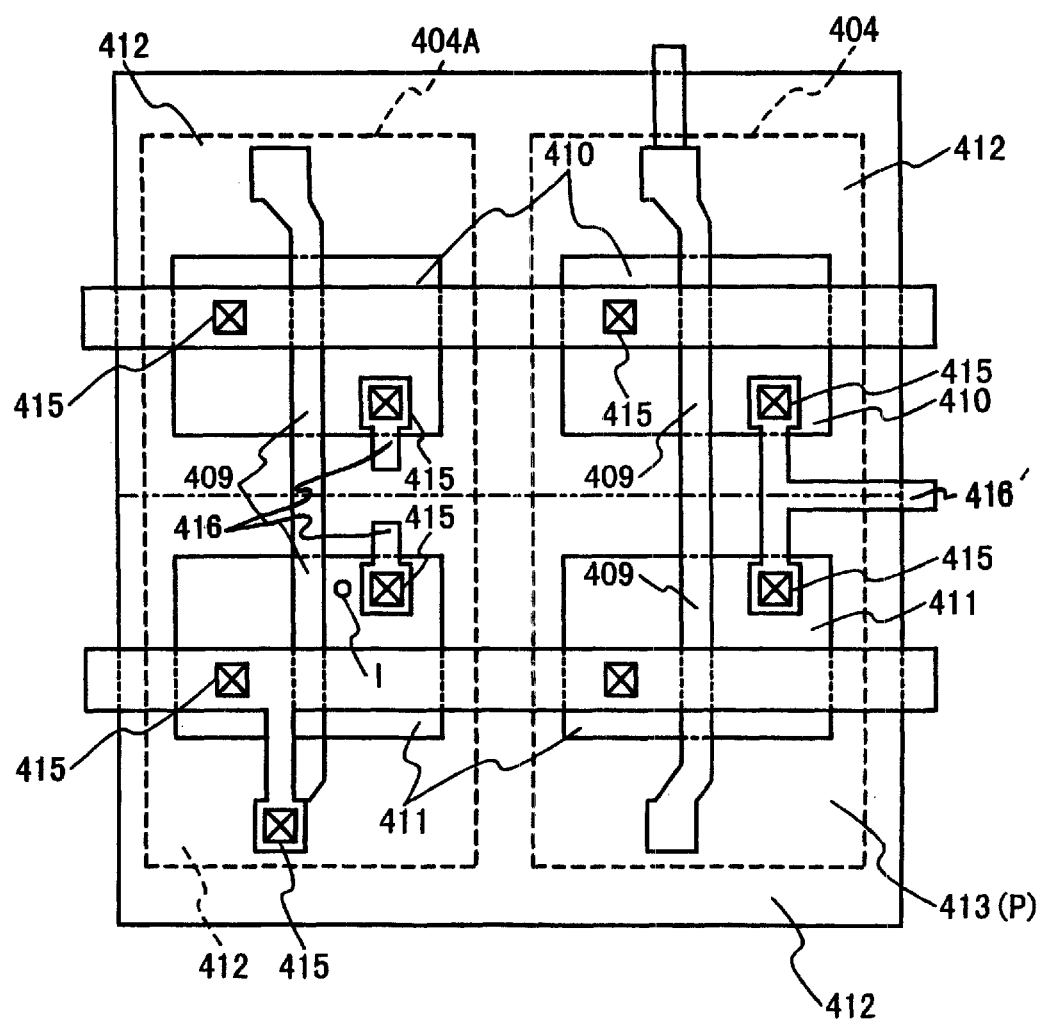
FIG. 7 shows a structure of a spare cell used in yet still another conventional layout method.
Figure 8:
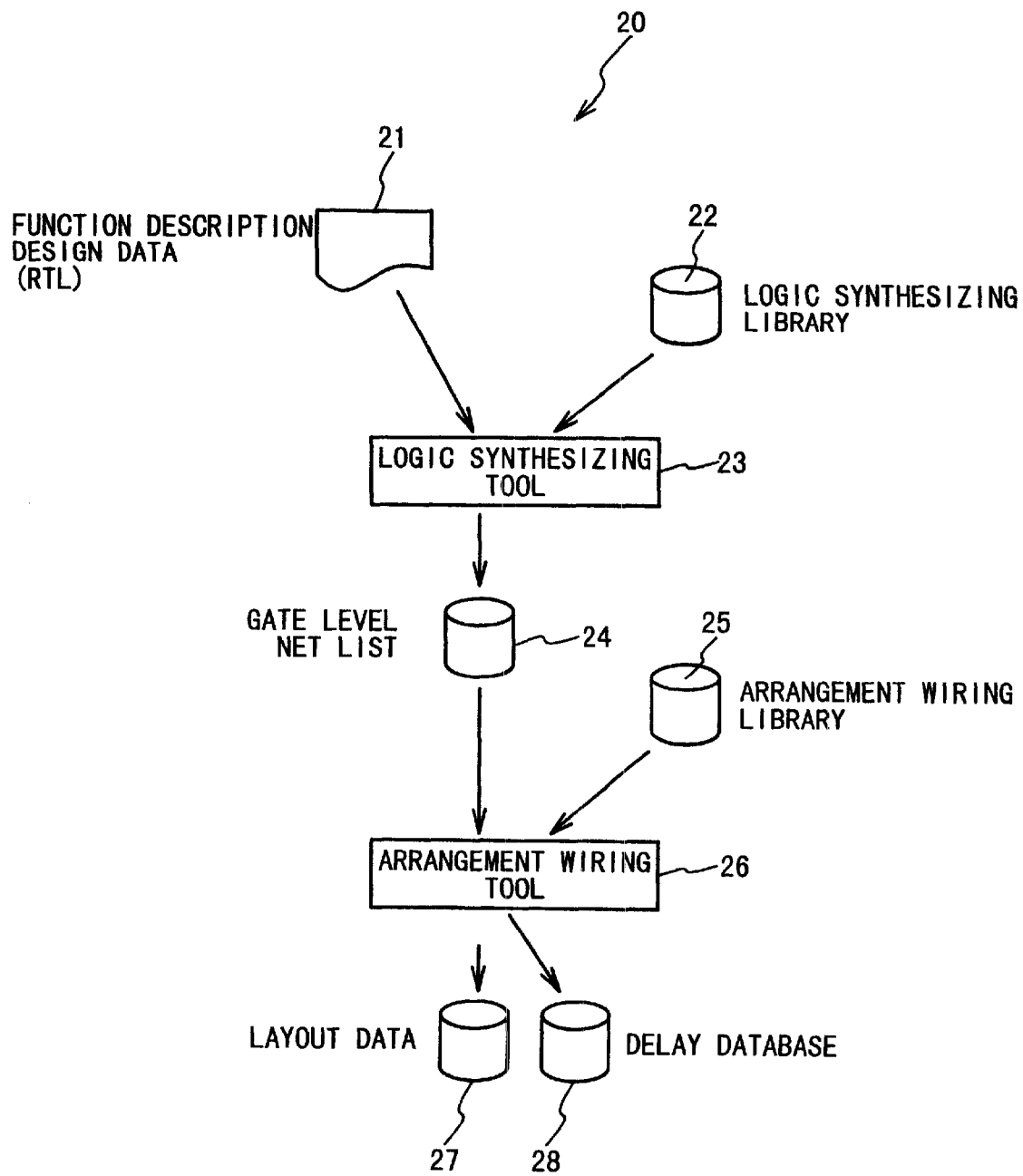
FIG. 8 shows a method for designing a layout of a semiconductor integrated circuit, according to the present embodiment.

The designing method is executed by an integrated circuit designing apparatus 20 shown in FIG. 8. The integrated circuit designing apparatus 20 includes a logic synthesizing tool 23. A function description design data 21 is inputted to the logic synthesizing tool 23. In the function description design data 21, functions of a semiconductor integrated circuit are described in a language of a register transfer level (RTL).

The logic synthesizing tool 23 refers to a logic synthesizing library 22, and generates a gate level net list 24 in accordance with the function description design data 21. In the logic synthesizing library 22, design information is registered with regard to macro circuits. A logical function for the macro circuit is recorded in the logic synthesizing library 22. A desirable function is attained by the combination of the macro circuits registered in the logic synthesizing library 22. In the gate level net list 24, the connection relation of signal lines between those macro circuits is described. The gate level net list 24 is inputted to an arrangement wiring tool 26.

The arrangement wiring tool 26 refers to an arrangement wiring library 25 and executes the arrangement and the wiring of the macro circuit in accordance with the gate level net list 24. The arrangement wiring library 25 stores therein the information with regard to the arrangement and the wiring for each macro circuit registered in the logic synthesizing library 22. The arrangement wiring library 25 includes a layout data corresponding to a mask pattern for each macro circuit. The information of a shape, a dimension and a terminal for each macro circuit, and a wiring inhibition area information are registered in the arrangement wiring library 25. The above-mentioned terminal information includes a position of the terminal, a terminal attribute of an input/output, a capacity of the capacitance, and an output impedance.

The arrangement wiring tool 26 outputs a layout data 27 and a delay database 28. The layout data 27 indicates a mask pattern for a semiconductor integrated circuit designed by integrated circuit designing apparatus 20. The delay database 28 stores therein a delay data for each net. The delay database 28 is used for logical verification.

In this case, a computer is used as the above-mentioned logic synthesizing tool 23 and the arrangement wiring tool 26. Also, the logic synthesizing library 22 and the arrangement wiring library 25 are stored in a computer-readable medium and accessed by the computer.

Figure 9:
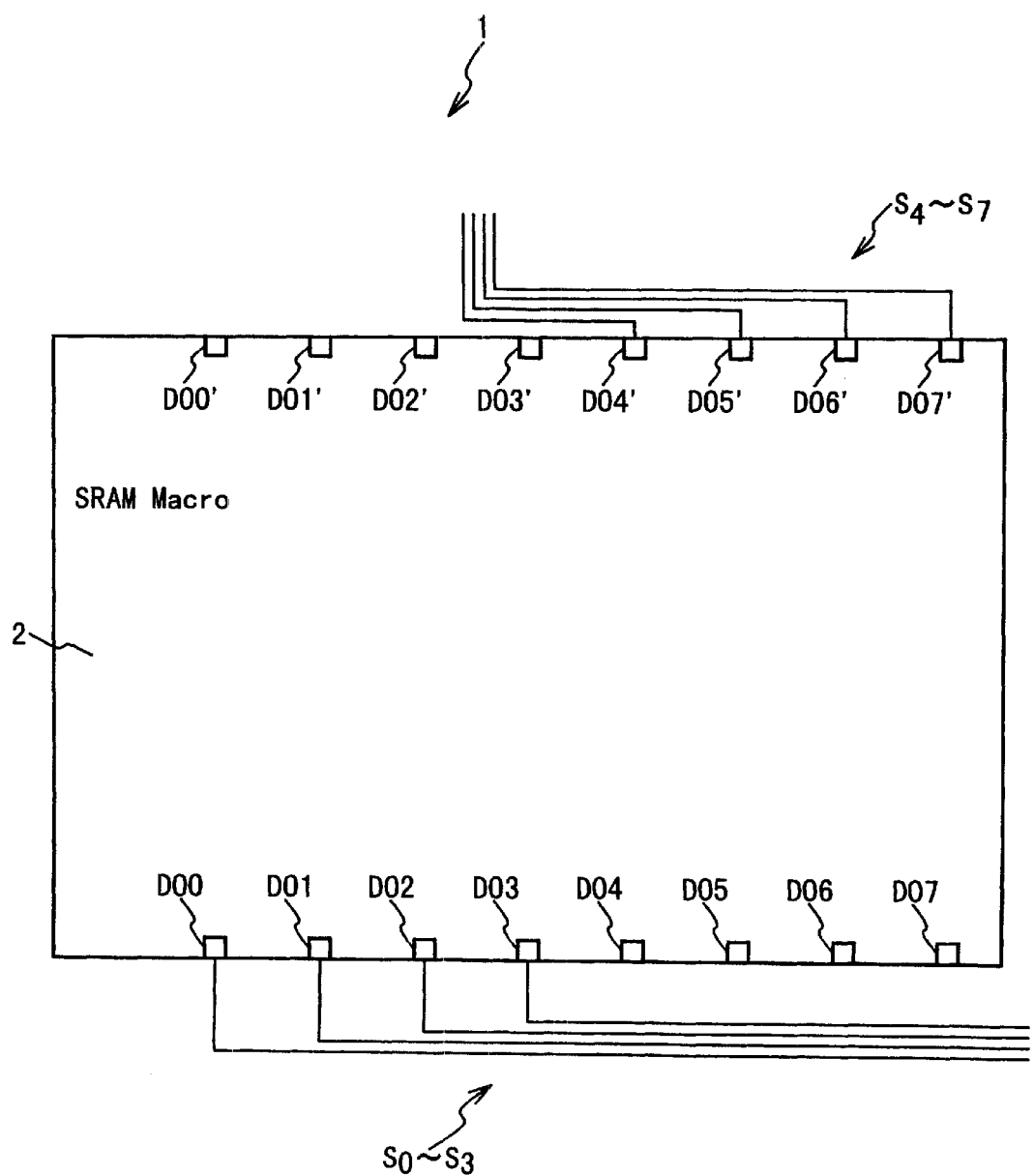
FIG. 9 shows a schematic of its macro circuit registered in the arrangement wiring library 25.

FIG. 9 shows a schematic of the macro circuit registered in the arrangement wiring library 25. The macro circuit 1 is a macro circuit for a SRAM (Static Random Access Memory). An inner portion 2 of the macro circuit 1 is provided with first to eighth output buffers D00 to D07 and first to eighth auxiliary output buffers D00' to D07' for outputting an 8-bit signal. The first output buffers D00 is connected to the first auxiliary output buffers D00' in the inner portion 2. The second output buffers D01 is connected to the second auxiliary output buffers D01' in the inner portion 2. The third output buffers D02 is connected to the third auxiliary output buffers D02' in the inner portion 2. The fourth output buffers D03 is connected to the fourth auxiliary output buffers D03' in the inner portion 2. The fifth output buffers D04 is connected to the fifth auxiliary output buffers D04' in the inner portion 2. The sixth output buffers D05 is connected to the sixth auxiliary output buffer D05' in the inner portion 2. The seventh output buffers D06 is connected to the seventh auxiliary output buffers D06' in the inner portion 2. And, the eighth output buffers D07 is connected to the eighth auxiliary output buffers D07' in the inner portion 2.

The macro circuit 1 is accommodated in a rectangular area having four sides. The first to eighth output buffers D00 to D07 are located on the lower one of the four sides. The first to eight auxiliary output buffers D00' to D07' are located on the upper one of the four sides.

Figure 10:
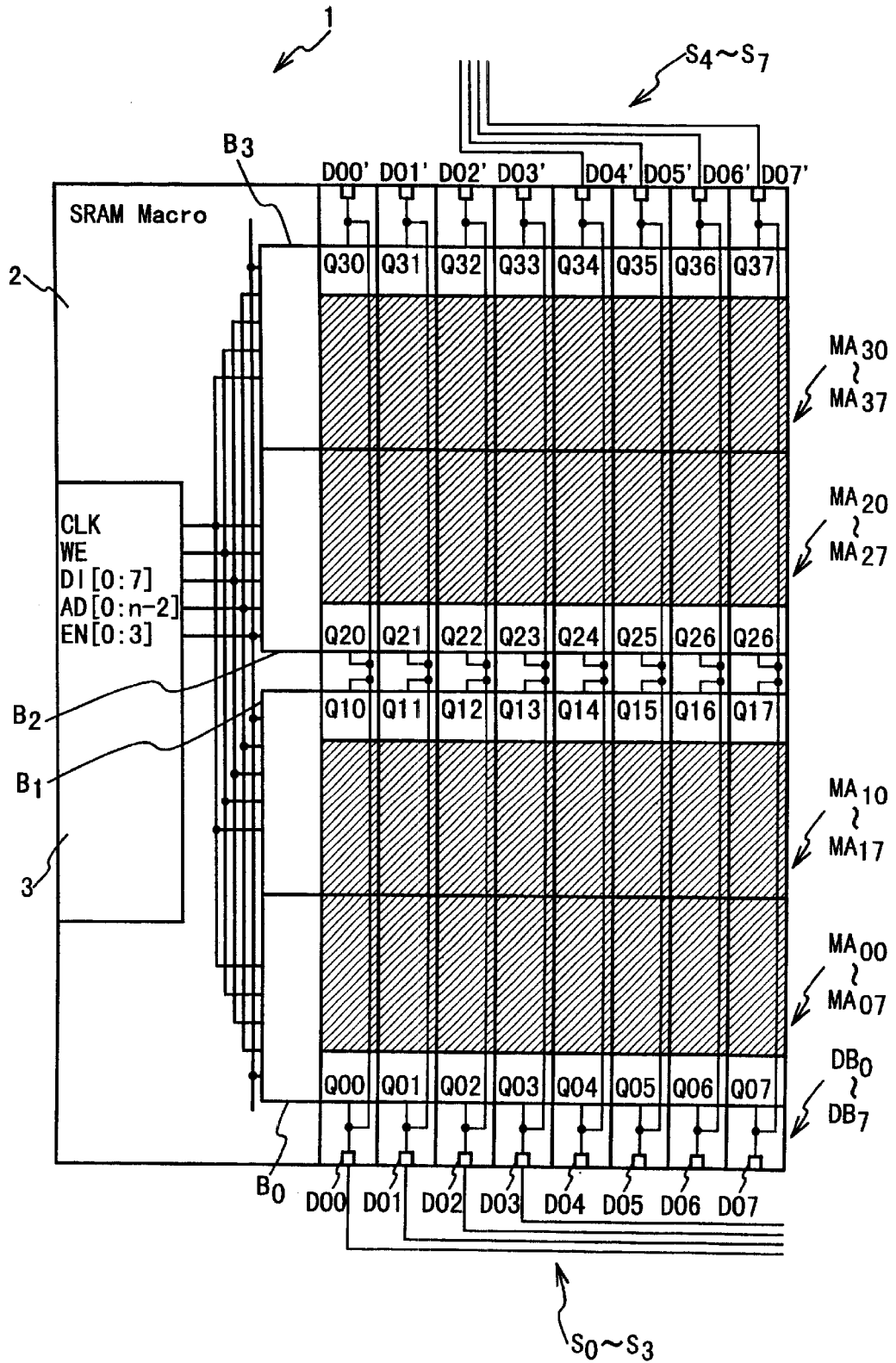
FIG. 10 shows the inner structure of the macro circuit 1.

FIG. 10 shows the inner structure of the macro circuit 1 in further detail. The inner portion 2 of the macro circuit 1 has first to fourth memory banks B0 to B3. The first bank B0 is composed of first to eighth memory areas MA00 to MA07 and first to eighth output buffers Q00 to Q07. The first to eighth output buffers Q00 to Q07 respectively output signals from the first to eighth memory areas MA00 to MA07. The second bank B1 is composed of $11^{th}$ to $18^{th}$ memory areas MA10 to MA17 and $11^{th}$ to $18^{th}$ output buffers Q10 to Q17. The $11^{th}$ to $18^{th}$ output buffers Q10 to Q17 respectively output signals from the $11^{th}$ to $18^{th}$ memory areas MA10 to MA17. The third bank B2 is composed of 21st to 28th memory areas MA20 to MA27 and 21st to 28th output buffers Q20 to Q27. The 21st to 28th output buffers Q20 to Q27 respectively output signals from the 21st to 28th memory areas MA20 to MA27. And, the fourth bank B3 is composed of $31^{st}$ to $38^{th}$ memory areas MA30 to MA37 and $31^{st}$ to $38^{th}$ output buffers Q30 to Q37. The $31^{st}$ to $38^{th}$ output buffers Q30 to Q37 respectively output signals from the $31^{st}$ to $38^{th}$ memory areas MA30 to MA37.

A control circuit 3 receives a clock signal CLK, a write signal WE, a write data DI, an address signal AD and an enable signal EN. The signals and the data are transferred to the first to fourth banks B0 to B3.

The first output buffer Q00, the 11th output buffer Q10, the 21st output buffer Q20 and the 31st output buffer Q30 are connected to the first output buffer D00 and the first auxiliary output buffer D00'. The second output buffer Q01, the 12th output buffer Q11, the 22nd output buffer Q21 and the 32nd output buffer Q31 are connected to the second output buffer D01 and the second auxiliary output buffer D01'. The third output buffer Q02, the 13th output buffer Q12, the 23rd output buffer Q22 and the 33rd output buffer Q32 are connected to the third output buffer D02 and the third auxiliary output buffer D02'. The fourth output buffer Q03, the 14th output buffer Q13, the 24th output buffer Q23 and the 34th output buffer Q33 are connected to the fourth output buffer D03 and the fourth auxiliary output buffer D03'. The fifth output buffer Q04, the 15th output buffer Q14, the 25th output buffer Q24 and the 35th output buffer Q34 are connected to the fifth output buffer D04 and the fifth auxiliary output buffer D04'. The sixth output buffer Q05, the 16th output buffer Q15, the 26th output buffer Q25 and the 36th output buffer Q35 are connected to the sixth output buffer D05 and the sixth auxiliary output buffer D05'. The seventh output buffer Q06, the 17th output buffer Q16, the 27th output buffer Q26 and the 37th output buffer Q36 are connected to the seventh output buffer D06 and the seventh auxiliary output buffer D06'. And, the eighth output buffer Q07, the 18th output buffer Q17, the 28th output buffer Q27 and the 38th output buffer Q37 are connected to the eighth output buffer D07 and the eighth auxiliary output buffer D07'.

The first output buffer D00 and the first auxiliary output buffer D00' output the substantially same signals to a rectangular area in which the macro circuit 1 is mounted. If a wiring is laid for connecting another circuit to the macro circuit 1, the wiring can be also connected to any of the first output buffer D00 and the first auxiliary output buffer D00'. The similar configuration can be established between the second to eighth output buffers D01 to D07 and the second to eighth auxiliary output buffers D01' to D07'. Thus, it is possible to avoid the wiring connected to the macro circuit 1 from being laid so as to bypass the macro circuit 1.

Figure 11:
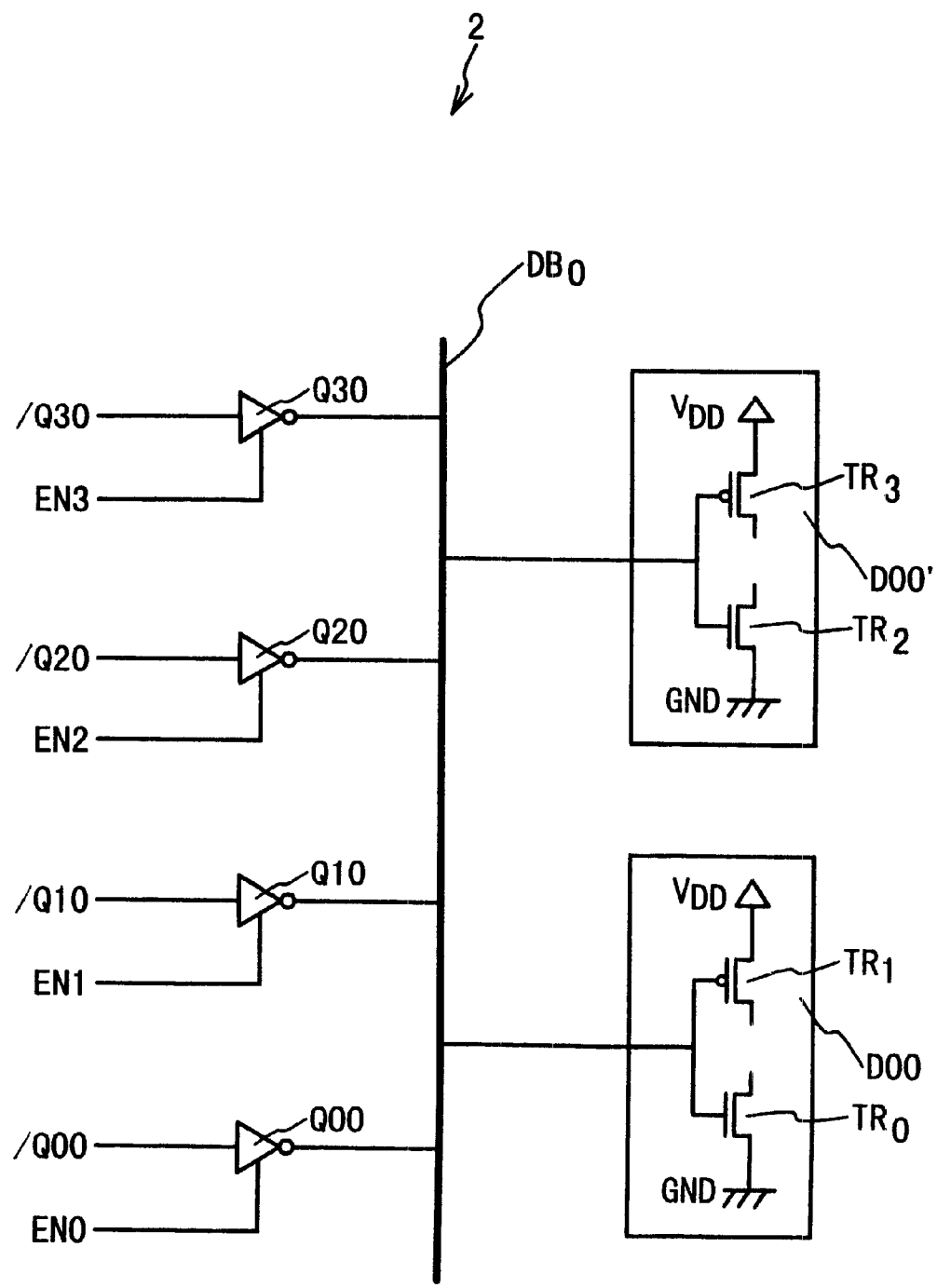
FIG. 11 shows a part of an equivalent circuit of the inner portion 2.

FIG. 11 shows a part of an equivalent circuit of the inner portion 2. FIG. 11 shows the part of the equivalent circuit in relation to a first output buffer Q00, an 11th output buffer Q10, a 21st output buffer Q20, a 31st output buffer Q30, a first output buffer D00 and a first auxiliary output buffer D00', in the inner portion 2.

The first output buffer Q00 is constituted by a gate circuit to which an input signal Q00 and an enable signal EN0 are inputted. The input signal /Q00 is generated by the memory area MA00. The 11th output buffer Q10 is constituted by a gate circuit to which an input signal /Q10 and an enable signal EN1 are inputted. The input signal /Q10 is generated by the memory area MA10. The 21st output buffer Q20 is constituted by a gate circuit to which an input signal /Q20 and an enable signal EN2 are inputted. The input signal /Q20 is generated by the memory area MA20. And, the 31st output buffer Q30 is constituted by a gate circuit to which an input signal /Q30 and an enable signal EN3 are inputted. The input signal /Q30 is generated by the memory area MA30.

The first output buffer D00 includes a buffer circuit composed of an N-type CMOS field effect transistor $TR_0$ and a P-type CMOS field effect transistor $TR_1$. The first auxiliary output buffer D00' includes a buffer circuit composed of an N-type CMOS field effect transistor $TR_2$ and a P-type field effect transistor $TR_3$.

Gates of the transistor $TR_0$ and the transistor $TR_1$ are connected through an inner data line DB0 to the first output buffer Q00, the 11th output buffer Q10, the 21st output buffer Q20 and the 31st output buffer Q30. A power supply voltage VDD is applied to a source of the transistor $TR_1$. A source of the transistor TR0 is connected to a ground GND. A drain of the transistor $TR_0$ forms an open first wiring end. A drain of the transistor $TR_1$ forms an open second wiring end. The first and second wiring ends composed of a pair of open drains can be connected by an outer wiring, as described later. The pair of drains forms an output wiring for sending an output signal corresponding to an input signal.

Gates of the transistor $TR_2$ and the transistor $TR_3$ are connected through the inner data line DB0 to the first output buffer Q00, the 11th output buffer Q10, the 21st output buffer Q20 and the 31st output buffer Q30. The power supply voltage VDD is applied to a source of the transistor $TR_3$. A source of the transistor $TR_2$ is connected to the ground GND. A drain of the transistor $TR_3$ and a drain of the transistor $TR_2$ are opened. The pair of open drains can be connected by an outer wiring, as described later.

Figure 13A:
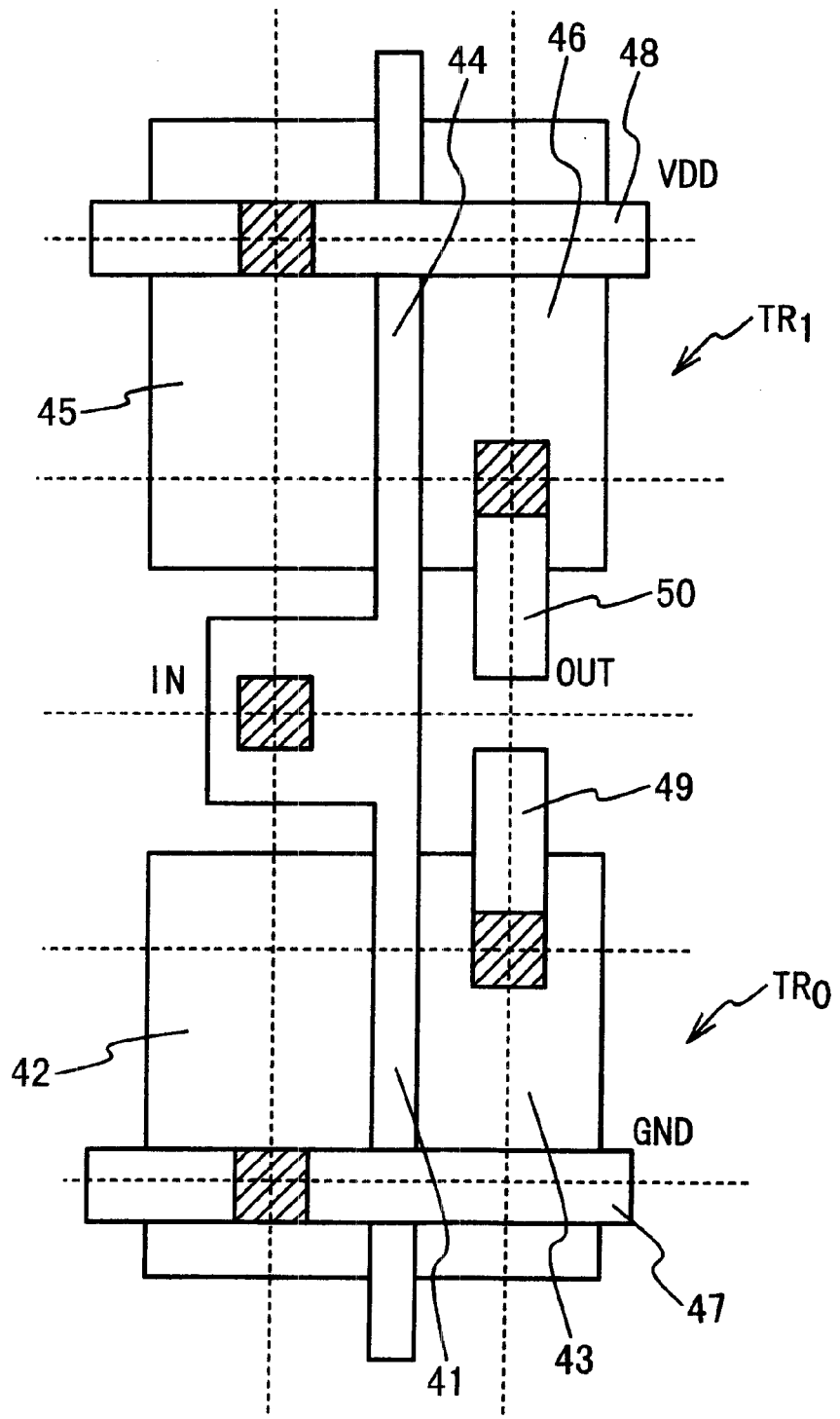
FIG. 13A shows a mask layout before the first outer wiring S0 is connected to the first output buffer D00.

FIG. 13A shows a mask pattern for the output buffer D00 stored in the arrangement wiring library 25. The gate 41 of the transistor $TR_0$ and the gate 44 of the transistor $TR_1$ are connected to each other. The source 42 of the transistor $TR_0$ is connected to the grounded line 47. The source 45 of the transistor $TR_1$ is connected to a power supply line 48 which is provided with the power supply voltage VDD. The first wiring 49 is connected to the drain 43. The second wiring 50 is connected to the drain 46. The first and second wiring 49 and 50 are apart from each other. The terminal IN is connected to the above mentioned output buffers Q00, Q10, Q20 and Q30. The transistor $TR_0$ and $TR_1$ are exclusively turned on or off in response to a signal inputted to the terminal IN. The output buffers D01 to D07 and the auxiliary output buffers D00' to D07' has the same mask pattern as the output buffers D00.

A semiconductor integrated circuit is designed by the above-mentioned integrated circuit designing apparatus 20 as described below.

As shown in FIG. 8, the gate level net list 24 is generated by the logic synthesizing tool 23 in accordance with the function description design data 21. The gate level net list 24 contains a net list corresponding to the macro circuit 1.

Next, the layout data 27 is generated by the arrangement wiring tool 26. In response to the net list, the layout data 27 includes the mask layout pattern of the macro circuit 1 registered in the arrangement wiring library 25 is included in the layout data 27.

Moreover, one of the output buffer D00 and the auxiliary output buffer D00' is selected as a first selected output buffer. A first outer wiring S0 is connected to the first selected output buffer.

Also, one of the output buffer D01 and the auxiliary output buffer D01' is selected as a second selected output buffer. A second outer wiring S1 is connected to the second selected output buffer.

Also, one of the output buffer D02 and the auxiliary output buffer D02' is selected as a third selected output buffer. A third outer wiring S2 is connected to the third selected output buffer.

Also, one of the output buffer D03 and the auxiliary output buffer D03' is selected as a fourth selected output buffer. A fourth outer wiring S3 is connected to the fourth selected output buffer.

Also, one of the output buffer D04 and the auxiliary output buffer D04' is selected as a fifth selected output buffer. A fifth outer wiring S4 is connected to the fifth selected output buffer.

Also, one of the output buffer D05 and the auxiliary output buffer D05' is selected as a sixth selected output buffer. A sixth outer wiring S5 is connected to the sixth selected output buffer.

Also, one of the output buffer D06 and the auxiliary output buffer D06' is selected as a seventh selected output buffer. A seventh outer wiring S6 is connected to the seventh selected output buffer.

Also, one of the output buffer D07 and the auxiliary output buffer D07' is selected as a eighth selected output buffer. A eighth outer wiring S7 is connected to the eighth selected output buffer.

The outer wiring S0 to S8 are connected to other cells included in the integrated circuit designed by the integrated circuit designing apparatus 20. In this case, the first to eighth selected output buffers are desirably selected such that the outer wiring S0 to S8 are as short as possible.

In the present embodiment, the first to fourth outer wirings S0 to S3 are connected to the first to fourth output buffers D00 to D03 as in FIG. 9. The fifth to eighth outer wirings S4 to S7 are connected to the fifth to eighth auxiliary output buffers D04' to D07'.

Figure 12:
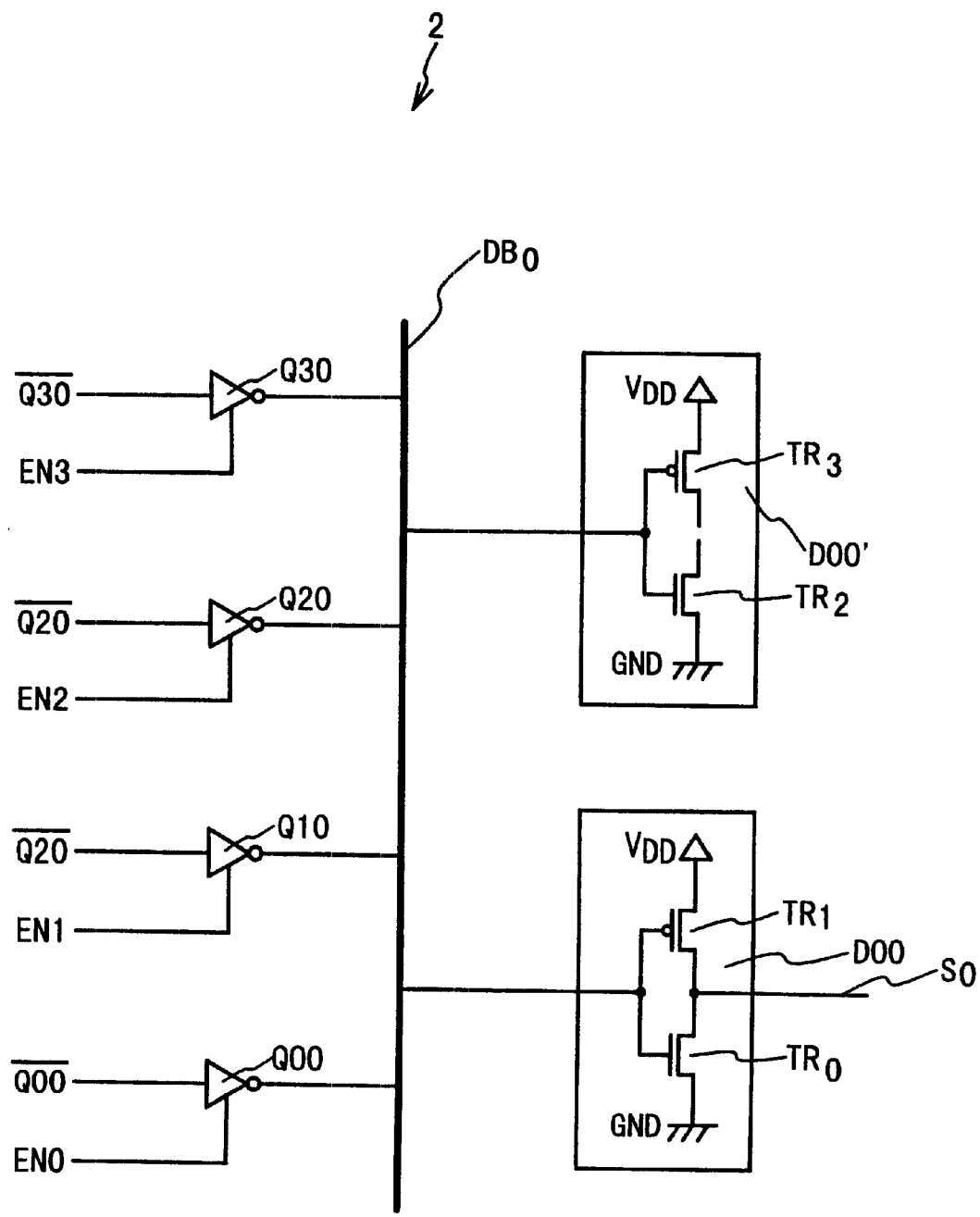
FIG. 12 shows an equivalent circuit at a state when the first outer wiring S0 is connected to the first output buffer D00 contained in the macro circuit 1.

FIG. 12 shows an equivalent circuit at a state when the first outer wiring S0 is connected to the first output buffer D00 contained in the macro circuit 1. When the first outer wiring S0 is connected to the first output buffer D00, the first outer wiring S0 couples the drain of the transistor $TR_0$ and the drain of the transistor $TR_1$ to each other. Due to this coupling, a current corresponding to a gate input flows through an output wiring composed of the drain of the transistor $TR_0$ and the drain of the transistor $TR_1$. Thus, an output signal is sent to the first outer wiring S0.

On the other hand, the first outer wiring S0 is not connected to the first auxiliary output buffer D00'. The open state is maintained between the drains of the transistors $TR_2$, $TR_3$, namely, between the first wiring and the second wiring.

This open state reduces the power consumption caused by the transistors TR$_2$, TR$_3$.

Figure 13B:
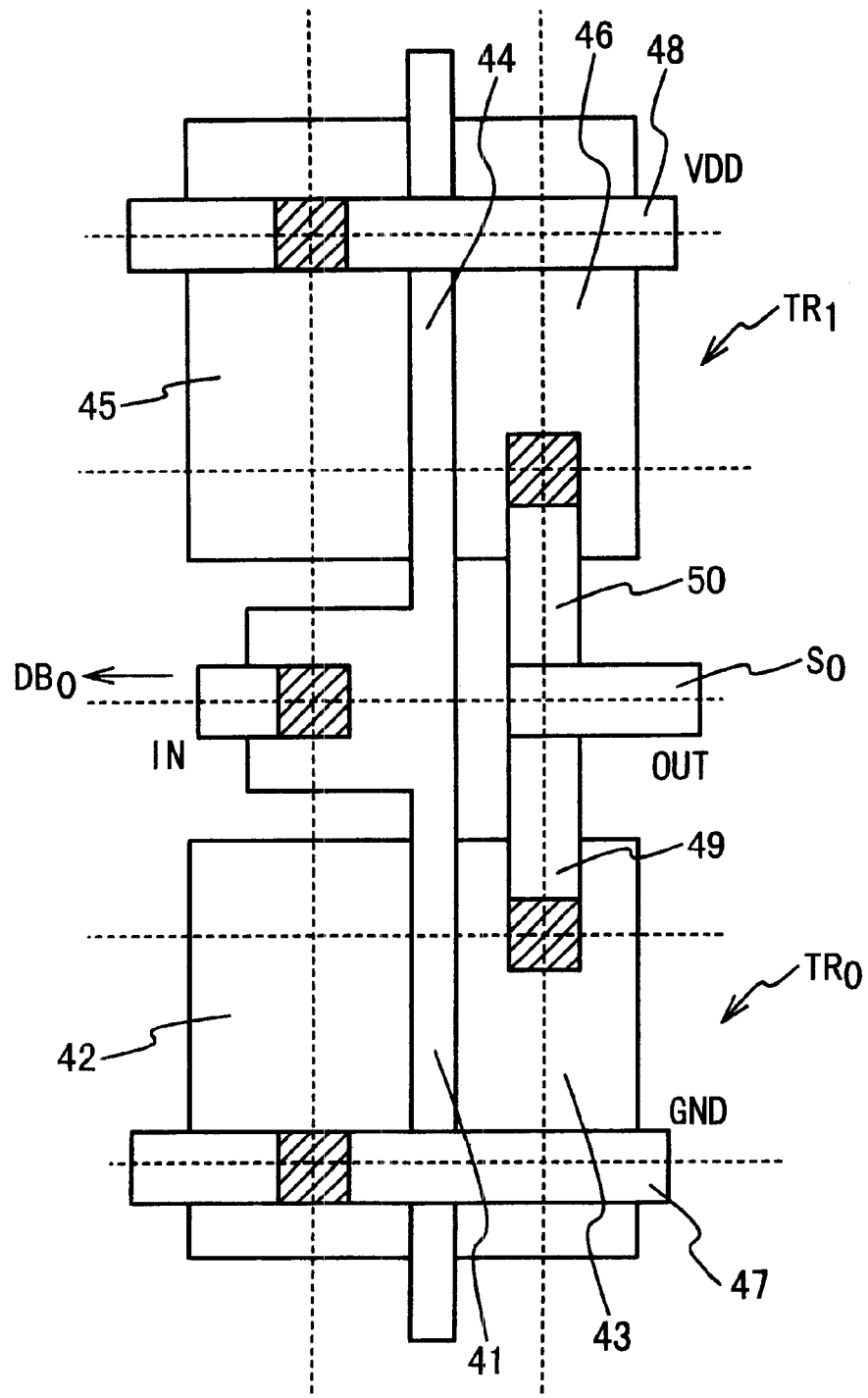
FIG. 13B shows a mask layout at a state when the first outer wiring S0 is connected to the first output buffer D00.

FIG. 13B shows a mask layout at a state when the first outer wiring S0 is connected to the first output buffer D00. The first and second wiring 49 and 50 are connected to each other through the first outer wiring S0. In this state, the first outer wiring S0 is used as a output terminal for outputting the signals from the output buffers Q00, Q10, Q20 and Q30.

Similarly, the disconnected drains of each of the output buffers D01, D02, D03 and the auxiliary output buffers D04', D05', D06', and D07' are respectively connected by the outer wiring S1, S2, S3, S4, S5, S6 and S7. Also, the disconnected drains of each of the output buffers D01, D02, D03 and the auxiliary output buffers D04', D05', D06' are left opened. The disconnected drains reduce the power consumption.

When a plurality of output terminals to one signal are mounted in a macro block, a capacitance difference is induced because of a difference between wiring lengths within the macro circuit. The capacitance difference results in a condition that a signal delay is different for each output terminal. In the semiconductor apparatus according to the present invention, a parameter with regard to a signal delay is set so as to obtain a constant delay performance, even if a signal is taken out of any of the plurality of output terminals. The parameter is stored in the logic synthesizing library 22 or the arrangement wiring library 25, and included in the delay database 28.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A designing method of a semiconductor integrated circuit, said integrated circuit comprising a plurality of macro circuits, said designing method comprising:
   providing a library storing a macro mask pattern for at least one macro circuit, said at least one macro circuit including:
      an inner circuit outputting an output signal; and
      a plurality of buffer circuits, each of which comprises:
         first and second wirings apart from each other;
         a first semiconductor element selectively supplying said first wiring with a power supply potential in accordance with said output signal; and
         a second semiconductor element selectively supplying said second wiring with a grounded potential in accordance with said output signal,
      wherein said macro mask pattern includes a plurality of buffer mask patterns, each of which corresponds to one of said plurality of buffer circuits, and each of said plurality of buffer mask patterns comprises:
         a first wiring pattern for said first wiring, and
         a second wiring pattern for said second wiring;
   selecting one of said plurality of buffer circuits as a selected buffer circuit; and
   arranging said macro mask pattern and a third wiring pattern for a third wiring to produce an integrated circuit mask pattern based on said library such that said first and second wiring patterns of said selected buffer circuit are connected with each other by said third wiring pattern.

2. The designing method according to claim 1, wherein said first semiconductor element comprises a P-channel MISFET, said P-channel MISEET including:
   a first source connected to a power supply line having a power supply voltage;
   a first drain connected to said first wiring; and
   a first gate having a first gate voltage in response to said output signal.

3. The designing method according to claim 1, wherein said second semiconductor element comprises an N-channel MISFET, said N-channel MISFET including:
   a second source connected to a grounded line;
   a second drain connected to said first wiring; and
   a second gate having a first gate voltage in response to said output signal.

4. The designing method according to claim 1, wherein said macro mask pattern is accommodated in a rectangular area having four sides,
   one of said plurality of buffer mask patterns is located on one of said four sides, and another one of said plurality of buffer mask patterns is located on another one of said four sides.

5. The designing method according to claim 1, wherein said integrated circuit mask pattern includes a cell mask pattern for a cell to be included in said semiconductor integrated circuit, said third wiring is connected to said cell, and
   said selected buffer circuit is selected based on determining that said third wiring is as short as possible.

6. A designing apparatus of a semiconductor integrated circuit, said semiconductor integrated circuit comprising a plurality of macro circuits, said designing apparatus comprising:
   a library storing a macro mask pattern for at least one macro circuit, said at least one macro circuit including:
      an inner circuit outputting an output signal; and
      a plurality of buffer circuits, each of which comprises:
         first and second wirings apart from each other;
         a first semiconductor element selectively supplying said first wiring with a power supply potential in accordance with said output signal; and
         a second semiconductor element selectively supplying said second wiring with a grounded potential in accordance with said output signal, wherein said macro mask pattern includes a plurality of buffer mask patterns, each of which corresponds to one of said plurality of buffer circuits, each of said plurality of buffer mask patterns comprising:
            a first wiring pattern for said first wiring; and
            a second wiring pattern for said second wiring; and
   an arrangement wiring tool which selects one of said plurality of buffer circuits as a selected buffer circuit and arranges said macro mask pattern and a third wiring pattern for a third wiring to produce an integrated circuit mask pattern based on said library such that said first and second wiring patterns of said selected buffer circuit are connected with each other by said third wiring pattern.

7. The designing apparatus according to claim 6, wherein said first semiconductor element comprises a P-channel MISFET, said P-channel MISFET including:
   a first source connected to a power supply line having a power supply voltage;
   a first drain connected to said first wiring; and
   a first gate having a first gate voltage in response to said output signal.

8. The designing apparatus according to claim 6, wherein said second semiconductor element comprises an N-channel MISFET, said N-channel MISFET including:

a second source connected to a grounded line;
a second drain connected to said first wiring; and
a second gate having a first gate voltage in response to said output signal.

9. The designing apparatus according to claim 6, wherein said macro mask pattern is accommodated in a rectangular area having four sides, one of said plurality of buffer mask patterns is located on one of said four sides, and another one of said plurality of buffer mask patterns is located on another one of said four sides.

10. The designing method according to claim 6, wherein said integrated circuit mask pattern includes a cell mask pattern for a cell to be included in said semiconductor integrated circuit, said third wiring is connected to said cell mask pattern, and said selected buffer circuit is selected based on determining that said third wiring is as short as possible.

11. A computer-readable recording medium recording a library for designing an integrated circuit, said library comprising:

a macro mask pattern for at least one macro circuit, wherein said at least one macro circuit includes:
an inner circuit outputting an output signal; and
a plurality of buffer circuits, each of which comprises:
first and second wirings apart from each other;
a first semiconductor element selectively supplying said first wiring with a power supply potential in accordance with said output signal; and
a second semiconductor element selectively supplying said second wiring with a grounded potential in accordance with said output signal,
said macro mask pattern including a plurality of buffer mask patterns, each of which corresponds to one of said plurality of buffer circuits, and each of said plurality of buffer mask patterns comprises:
a first wiring pattern for said first wiring; and
a second wiring pattern for said second wiring.

12. The computer-readable recording medium according to claim 11, wherein said first semiconductor element comprises a P-channel MISFET, said P-channel MISFET including:
a first source connected to a power supply line having a power supply voltage;
a first drain connected to said first wiring; and
a first gate having a first gate voltage in response to said output signal.

13. The computer-readable recording medium according to claim 11, wherein said second semiconductor element comprises an N-channel MISFET, said N-channel MISFET including:
a second source connected to a grounded line;
a second drain connected to said first wiring; and
a second gate having a first gate voltage in response to said output signal.

14. A computer-readable recording medium according to claim 11, wherein said macro mask pattern is accommodated in a rectangular area having four sides, one of said plurality of buffer mask patterns is located on one of said four sides, and another one of said plurality of buffer mask patterns is located on another one of said four sides.

15. A method of designing routing wiring for an integrated circuit, said method comprising:

providing a macro mask pattern for a macro circuit as a component of said integrated circuit, said macro circuit including:
an inner circuit outputting an output signal; and
a plurality of patterns for a buffer circuit for said output signal, each said buffer circuit pattern located on a different edge of said macro mask pattern and including an internally-incomplete wiring interconnection, each said pattern being provided with a same set of inputs and potentially providing said output signal as being the corresponding output signal from said macro circuit;

selecting one of said plurality of patterns of said buffer circuit as being a selected buffer for said output signal, as based on determining a shortest interconnect distance from said output signal of said macro circuit to a subcircuit of said integrated circuit that uses said output signal;

completing an interconnect for said shortest interconnect distance between said output signal of said macro circuit and said subcircuit that uses said output signal; and completing the internally-incomplete wiring interconnection of said selected buffer circuit pattern, thereby allowing only said selected buffer to consume electrical power while also providing a shortest interconnect for said output signal from said macro circuit.

* * * * *